US010659583B2

(12) United States Patent
Lee et al.

(10) Patent No.: US 10,659,583 B2
(45) Date of Patent: *May 19, 2020

(54) MOBILE TERMINAL

(71) Applicant: LG ELECTRONICS INC., Seoul (KR)

(72) Inventors: Kiyong Lee, Seoul (KR); Cheongsun Yun, Seoul (KR); Jongwook Mun, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/664,469

(22) Filed: Oct. 25, 2019

(65) Prior Publication Data

US 2020/0059545 A1    Feb. 20, 2020

Related U.S. Application Data

(63) Continuation of application No. 16/216,478, filed on Dec. 11, 2018, now Pat. No. 10,491,726.

(30) Foreign Application Priority Data

Jan. 3, 2018   (KR) .................. 10-2018-0000782

(51) Int. Cl.
*H04M 1/00* (2006.01)
*H04M 1/02* (2006.01)
(Continued)

(52) U.S. Cl.
CPC ...... *H04M 1/0266* (2013.01); *H01L 27/3227* (2013.01); *H01L 27/3232* (2013.01);
(Continued)

(58) Field of Classification Search
USPC .................... 455/566; 345/81; 715/716; 1/1
See application file for complete search history.

(56) References Cited

U.S. PATENT DOCUMENTS 9,048,094 B2   6/2015  Miyanaga et al.
9,478,597 B2  10/2016  Yamazaki et al.
(Continued)

FOREIGN PATENT DOCUMENTS

JP         4-264388 A      9/1992

*Primary Examiner* — David Q Nguyen
(74) *Attorney, Agent, or Firm* — Birch, Stewart, Kolasch & Birch, LLP

(57) ABSTRACT

A mobile terminal includes a housing having a front side, a rear side and lateral sides; a cover window disposed on the front side of the housing and defining a display area and a bezel area, wherein the bezel area includes printed color under an edge of the cover window; an OLED display unit disposed between the cover window and the front side of the housing; and a sensing unit disposed under the OLED display unit. Further, the OLED display unit includes a substrate having a hole below the display area of the cover window; a transistor layer including thin film transistors and being disposed on the substrate and having a hole corresponding to the hole of the substrate; an organic light emitting layer disposed on the transistor layer and having a hole corresponding to the hole of the transistor layer; and an encapsulation layer disposed on the organic light emitting layer and having a hole corresponding to the hole of the organic light emitting layer. In addition, the sensing unit senses a light transmitted through the holes.

28 Claims, 8 Drawing Sheets

(51) Int. Cl.
*H01L 27/32* (2006.01)
*H01L 51/56* (2006.01)
*H01L 51/52* (2006.01)

(52) U.S. Cl.
CPC ...... *H01L 27/3246* (2013.01); *H01L 27/3276* (2013.01); *H01L 51/5253* (2013.01); *H01L 51/56* (2013.01); *H01L 27/3244* (2013.01); *H01L 2227/323* (2013.01)

(56) References Cited

U.S. PATENT DOCUMENTS

| | | |
|---|---|---|
| 10,026,625 B2 | 7/2018 | Schmid et al. |
| 2007/0024547 A1* | 2/2007 | Jang ................. G09G 3/3233 345/81 |
| 2010/0065838 A1 | 3/2010 | Yamazaki et al. |
| 2012/0106201 A1 | 5/2012 | Choi et al. |
| 2015/0301793 A1* | 10/2015 | Craig ................. G06F 3/04847 715/716 |
| 2016/0313480 A1* | 10/2016 | Lee ..................... B32B 27/308 |
| 2016/0351645 A1* | 12/2016 | You ..................... H01L 27/326 |
| 2017/0316738 A1* | 11/2017 | Sohn .................. G09G 3/3225 |
| 2017/0373036 A1* | 12/2017 | Yamazaki ............ H01L 25/048 |
| 2018/0061904 A1* | 3/2018 | Shim .................. H01L 27/3206 |
| 2018/0069048 A1* | 3/2018 | Wu ........................ G02B 5/208 |
| 2018/0129798 A1* | 5/2018 | He ..................... G06K 9/00013 |
| 2018/0147810 A1 | 5/2018 | Cheon |
| 2018/0310426 A1 | 10/2018 | Cho et al. |
| 2018/0331320 A1* | 11/2018 | Su ..................... H01L 51/5253 |
| 2018/0337336 A1* | 11/2018 | Xu ..................... H01L 27/3248 |
| 2018/0348929 A1 | 12/2018 | Rhe et al. |
| 2019/0034020 A1* | 1/2019 | He ..................... G02F 1/13338 |

* cited by examiner

[FIG. 1]
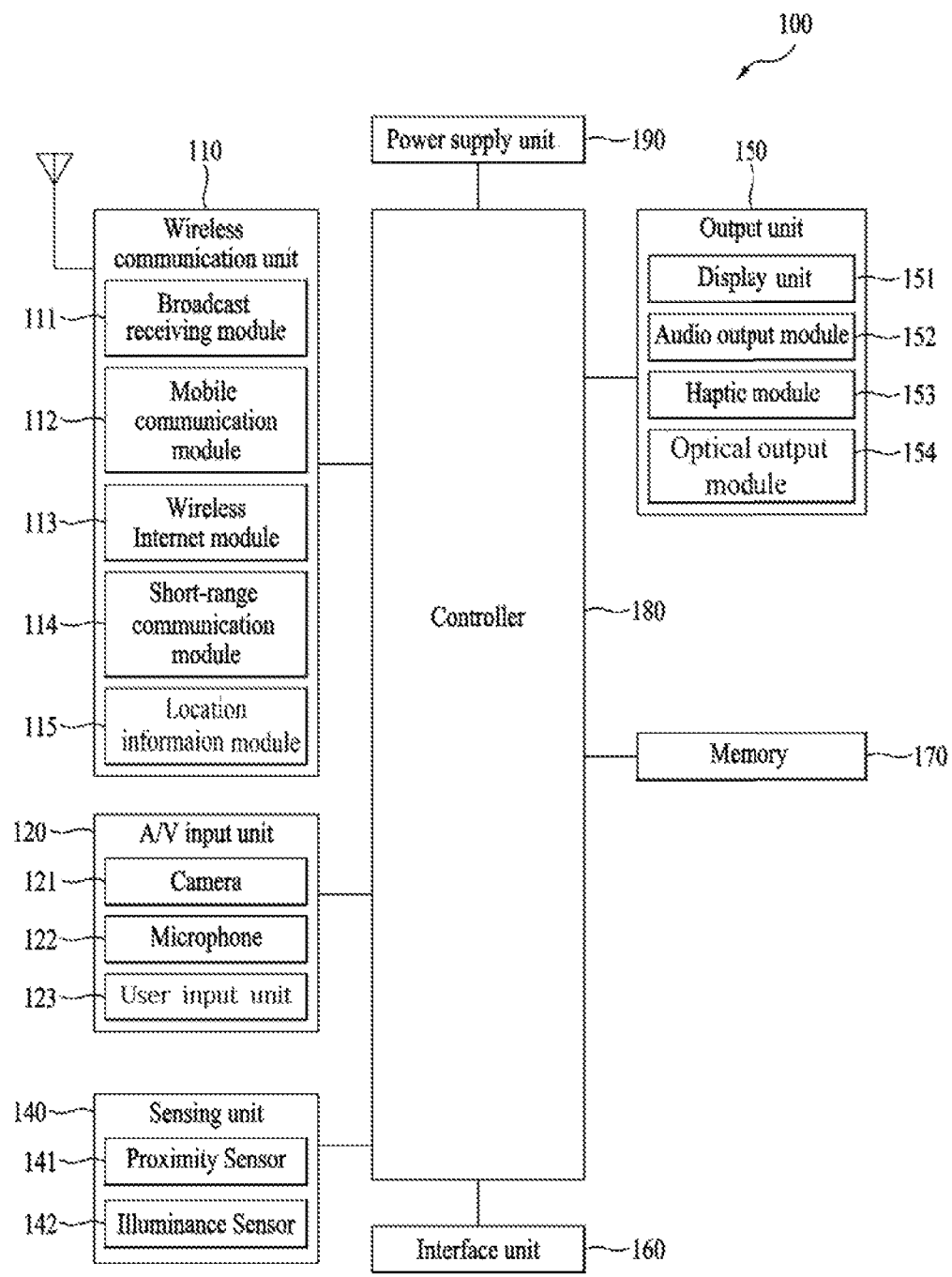

[FIG. 2]
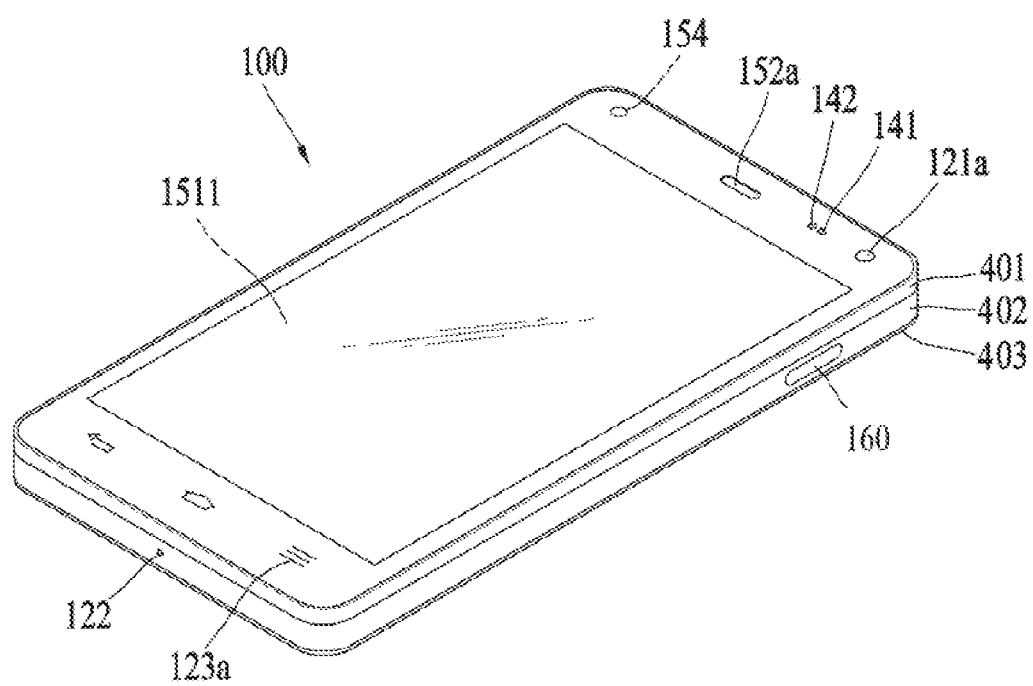

[FIG. 3]
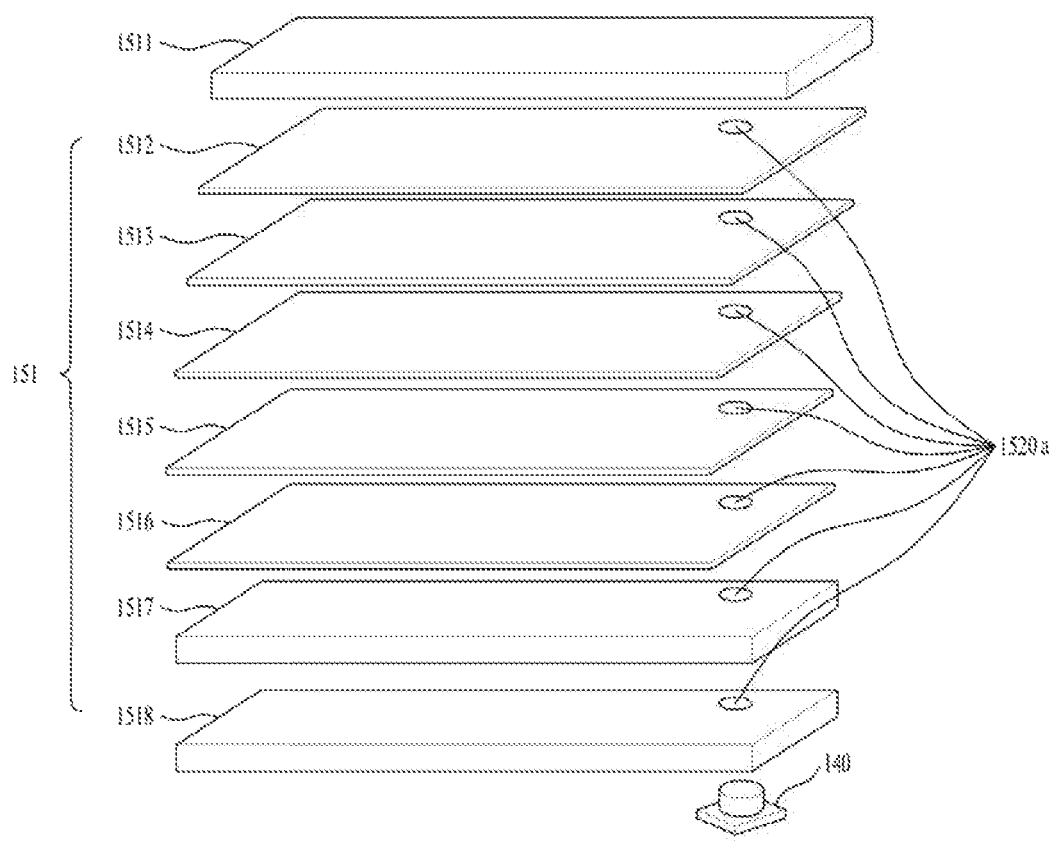

[FIG. 4]
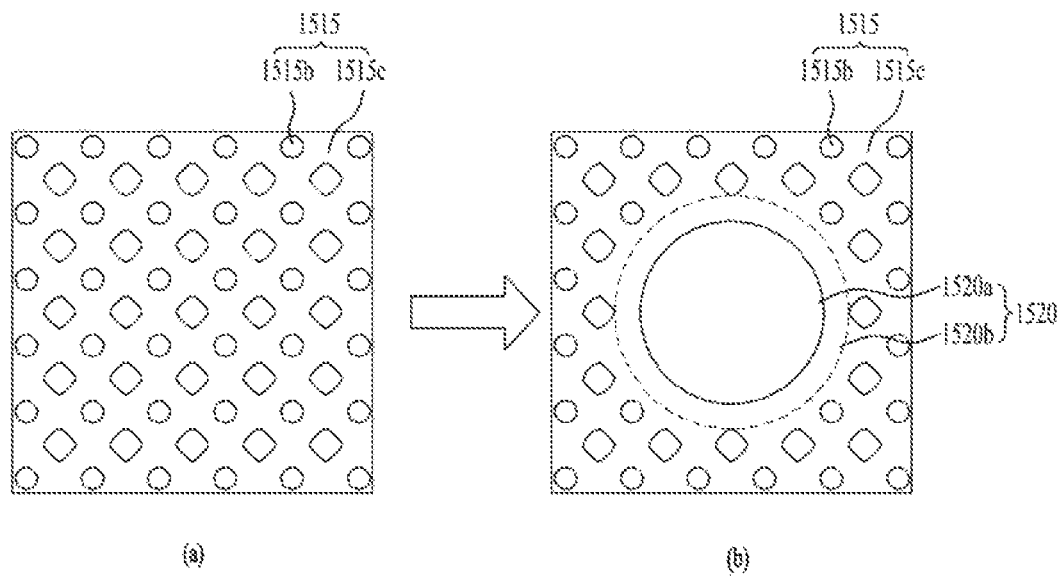
[FIG. 5]
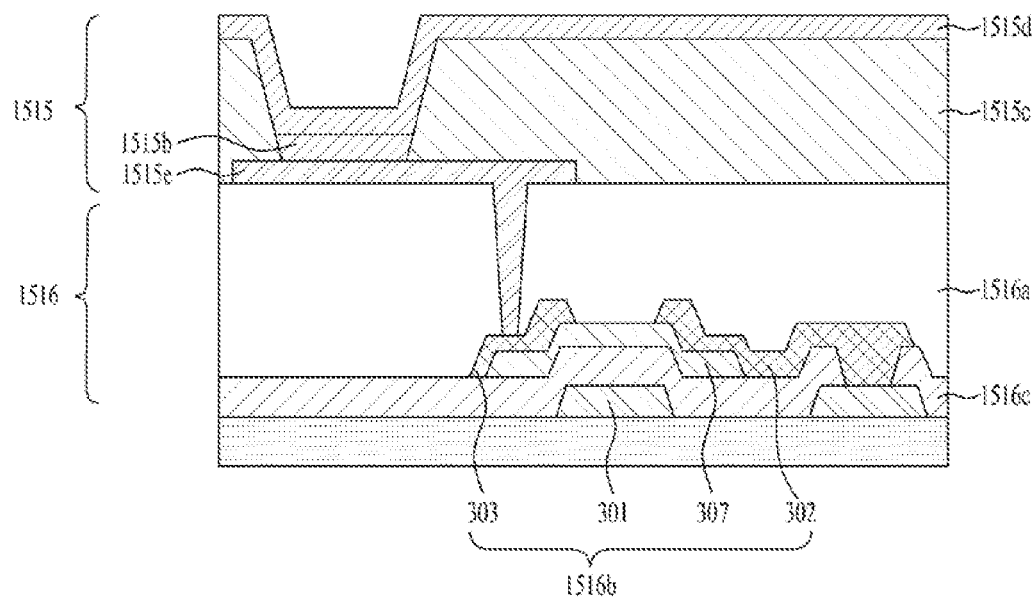

[FIG. 6]
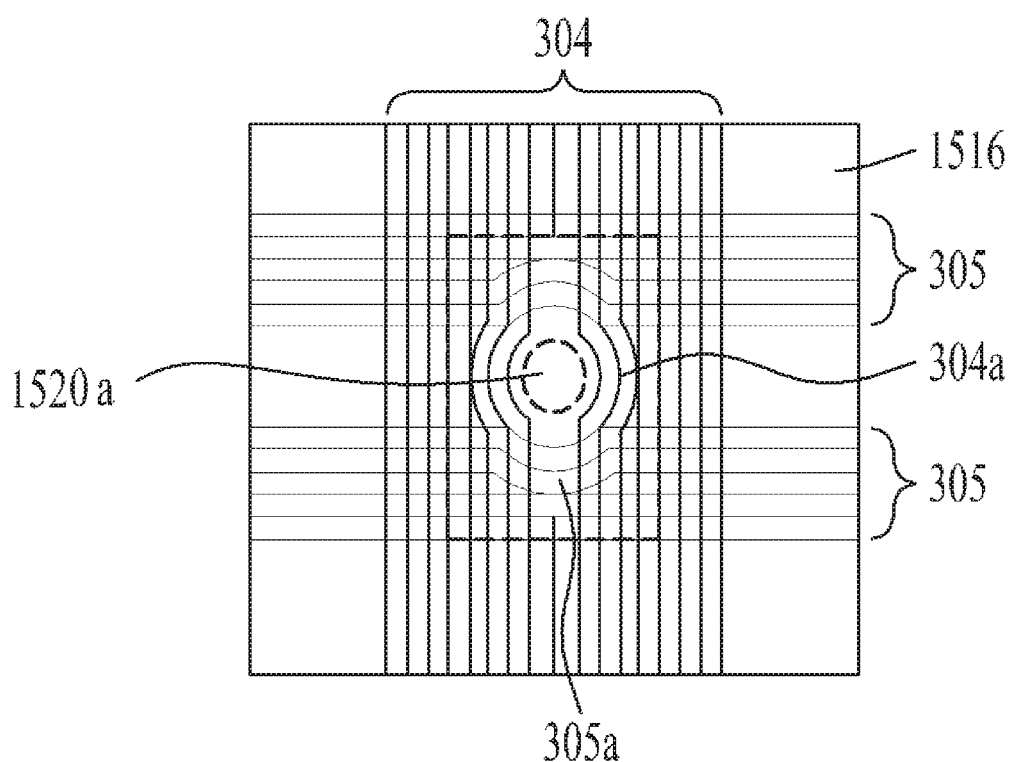

[FIG. 7]
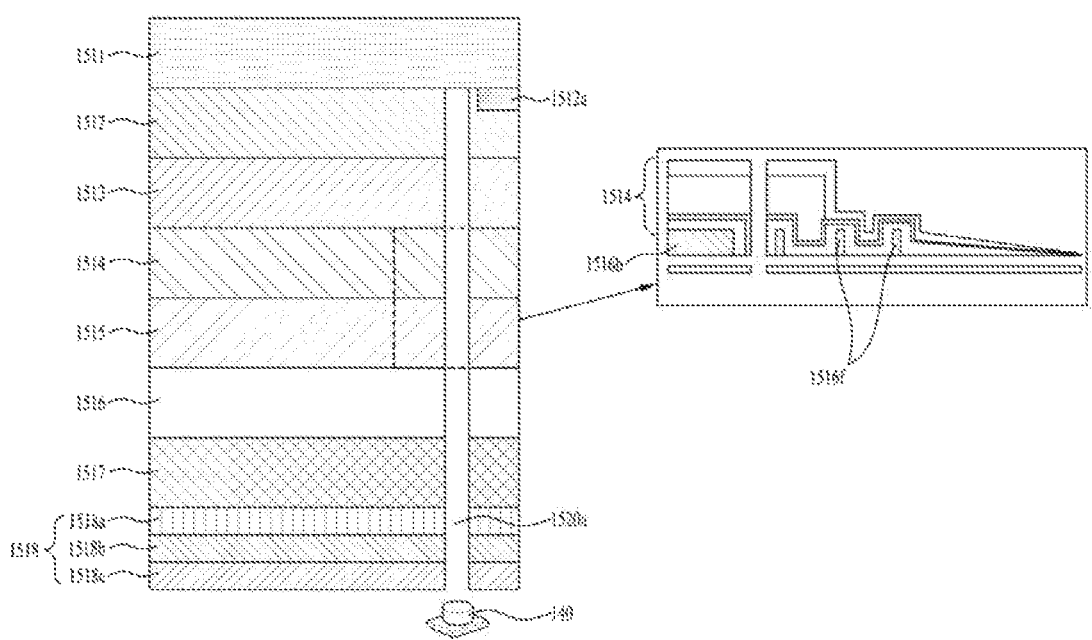

[FIG. 8]
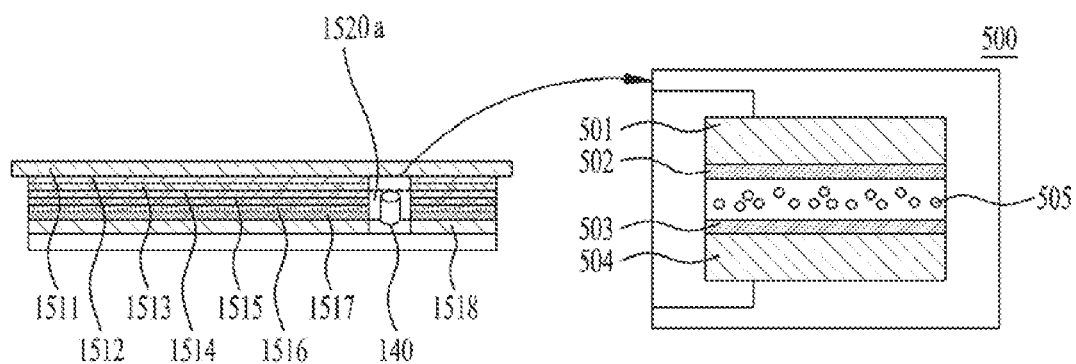
[FIG. 9]
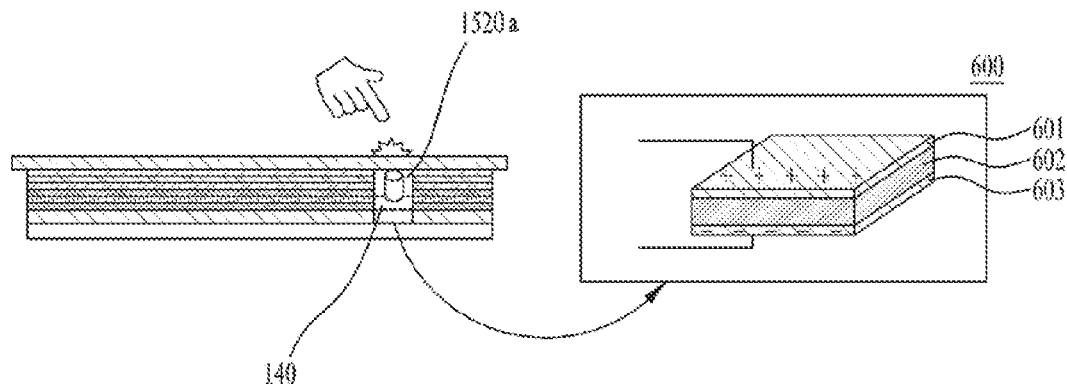

[FIG. 10]
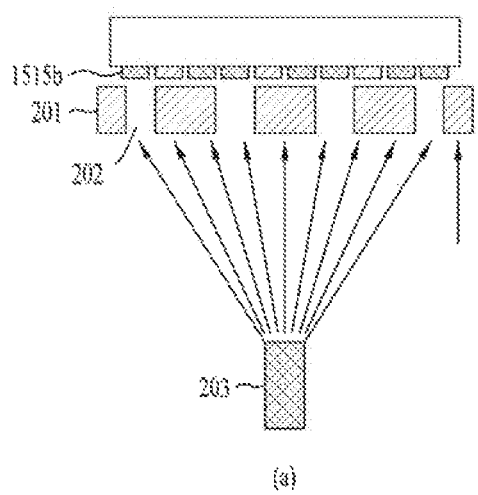
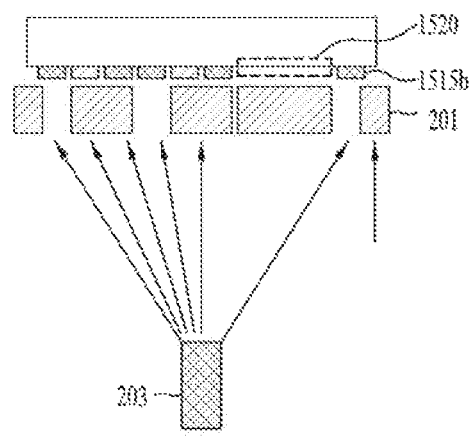
(a) (b)

MOBILE TERMINAL

CROSS-REFERENCE TO RELATED APPLICATIONS

This Application is a Continuation of co-pending U.S. patent application Ser. No. 16/216,478 filed on Dec. 11, 2018, which claims the priority benefit under 35 U.S.C. § 119(a) to Korean Patent Application No. 10-2018-0000782 filed in the Republic of Korea on Jan. 3, 2018, all of which are hereby expressly incorporated by reference into the present application.

BACKGROUND OF THE DISCLOSURE

Field of the Disclosure

Embodiments of the present disclosure relate to a mobile terminal which may realize a full front display by providing a hole in a display unit and implement a sensor provided under the display unit via a hole.

Background of the Disclosure

Terminals may be generally classified as mobile/portable terminals or stationary terminals. Such terminals may be classified as handheld terminals and vehicle mounted terminals according to presence of a user's direct portability.

As such functions become more diversified, the mobile terminal can support more complicated functions such as capturing images or video, reproducing music or video files, playing games, receiving broadcast signals, and the like. By comprehensively and collectively implementing such functions, the mobile terminal may be embodied in the form of a multimedia player or device.

Recently, there are increasing demands for a full display which occupies a front one surface of a display unit so as to provide a user with a wide screen and enhance the portability.

SUMMARY OF THE DISCLOSURE

Accordingly, an object of the present invention is to address the above-noted and other problems and provide a mobile terminal which includes a hole provided in a display unit to realize a full front display and implements a sensor provided under the display unit via the hole.

Embodiments of the present disclosure provide a mobile terminal including a housing provided to define a predetermined accommodating space and comprising a cover window configured to transmit light and disposed on one surface; a display unit provided under the cover window; a hole penetrating the display unit to contact with a lower surface of the cover window; and a sensing unit provided under the display unit and configured to sense the light transmitting the cover window via the hole.

Embodiments of the present disclosure also provide a method for manufacturing a mobile terminal including a step for forming a plastic substrate; a step for disposing a transistor film on the plastic substrate, the transistor film comprising a thin film transistor; a step for disposing an organic light emitting layer on the transistor film, the organic light emitting layer comprising spontaneous light emitting elements configured to emit preset colors by the flow of the currents controlled by the thin film transistor; a step for disposing a film configured to shut off the spontaneous light emitting elements from oxygen or moisture on the organic light emitting layer; a step for adhere a protection film configured to support the plastic substrate to a lower surface of the plastic substrate; a step for disposing a polarizing plate on the film; a step form forming a hole penetrating from the protection from the polarizing plate; and a step form disposing a cover window on the polarizing plate.

According to the embodiment of the present disclosure, the mobile terminal has following advantages. The hole is provided in the display unit and the sensor is implemented via the hole. Accordingly, the mobile terminal can realize a full display in which the display unit is expanded to a full front surface.

Furthermore, the spontaneous light emitting elements are designed on the organic light emitting layer provided in the display unit, with the predetermined margin with respect to the hole. Accordingly, the spontaneous light emitting elements can be protected from the moisture or oxygen inside the hole. Still further, the organic light emitting layer can be formed according to new FMM (Fine Metal Mask) method to dispose the spontaneous light emitting elements on the other area except the hole-penetrating area.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings, which are given by illustration only, and thus are not limitative of the present invention, and wherein:

FIG. 1 is a block diagram of a mobile terminal in accordance with the present disclosure;

FIG. 2 is a perspective diagram of the mobile terminal;

FIG. 3 is a diagram illustrating a cover window, a display unit and a sensing unit implemented to perform sensing via a hole provided in the display unit;

FIG. 4 is a front view of an organic light emitting layer which composes the display unit;

FIG. 5 is a sectional diagram schematically illustrating a transistor film and the organic light emitting layer which compose the display unit;

FIG. 6 is a diagram illustrating a wiring structure of the transistor film provided in the display unit;

FIG. 7 is a sectional diagram schematically illustrating the cover window and the display unit (FIG. 7(a)) and enlargedly illustrating an organic light emitting layer and a film which are located adjacent to the hole;

FIG. 8 is a diagram including a sectional view of the display unit and the cover window having an auxiliary film disposed on a front surface of the sensing unit and an enlarged sectional view of the auxiliary film;

FIG. 9 is a diagram including the display unit and the cover window having an auxiliary film disposed on a lower surface of the sensing unit and an enlarged sectional view of the auxiliary film; and FIG. 10 is a diagram illustrating FMM (Fine Metal Mask) which is configured to dispose a spontaneous emission element on the organic light emitting layer, except an area which is penetrated by the hole.

DETAILED DESCRIPTION OF THE EMBODIMENTS

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

Although the terms first, second, etc. may be used herein to describe various elements, these elements should not be limited by these terms. These terms are generally only used to distinguish one element from another.

When an element is referred to as being "connected with" another element, the element can be connected with the other element or intervening elements may also be present. In contrast, when an element is referred to as being "directly connected with" another element, there are no intervening elements present.

A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

FIG. 1 is a block diagram of a mobile terminal in accordance with the present disclosure, and FIG. 2 is conceptual views of one example of the mobile terminal. The mobile terminal 100 is shown having components such as a wireless communication unit 110, an input unit 120, a sensing unit 140, an output unit 150, an interface unit 160, a memory 170, a controller 180, and a power supply unit 190. Implementing all of the illustrated components is not a requirement, and that greater or fewer components may alternatively be implemented.

Referring now to FIG. 1, the mobile terminal 100 is shown having wireless communication unit 110 configured with several commonly implemented components. For instance, the wireless communication unit 110 typically includes one or more components which permit wireless communication between the mobile terminal 100 and a wireless communication system or network within which the mobile terminal is located.

The wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks. To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, in FIG. 1, the sensing unit 140 is shown having a proximity sensor 141 and an illumination sensor 142.

If desired, the sensing unit 140 may alternatively or additionally include other types of sensors or devices, such as a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154.

The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 can provide or process information or functions appropriate for a user by processing signals, data, information and the like, which are input or output by the various components depicted in FIG. 1, or activating application programs stored in the memory 170. As one example, the controller 180 controls some or all of the components illustrated in FIGS. 1 and 2 according to the execution of an application program that have been stored in the memory 170.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Referring now to FIG. 2, the mobile terminal 100 is described with reference to a bar-type terminal body. However, the mobile terminal 100 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch-type, glasses-type, and the like). However, such teachings with regard to a particular type of mobile terminal will generally apply to other types of mobile terminals as well.

The mobile terminal 100 will generally include a case (for example, frame, housing, cover, and the like) forming the appearance of the terminal. In this embodiment, the case is formed using the display unit 151 and a rear case 102. Various electronic components are incorporated into a space formed between the display unit 151 and the rear case 102. Middle case 210 may be additionally positioned between the display unit 151 and the rear case 102.

In recent years, as the size of a window 151*a* of the display unit 151 increases, the window 151*a* of the display unit 151 can be configured to cover the entire front surface. The mobile terminal 100 may form a curved surface with a side surface in order to improve a feeling of grip. Thus, the outer surface of the middle case 210 may be formed as a convex surface, or the edge of the display unit 151 may be bent in the back surface direction and coupled to the middle case 210. In addition, the rear case 102 may be formed such that the edge thereof is bent in the front direction.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121*b* or an audio output module 152*b*.

The cases 210, 102, 103 may be formed by injection-molding synthetic resin or may be formed of a metal, for example, stainless steel (STS), aluminum (Al), titanium (Ti), or the like. As an alternative to the example in which the plurality of cases form an inner space for accommodating components, the mobile terminal 100 may be configured such that one case forms the inner space. In this example, a mobile terminal 100 having a uni-body is formed so synthetic resin or metal extends from a side surface to a rear surface.

If desired, the mobile terminal 100 may include a waterproofing unit for preventing introduction of water into the terminal body. For example, the waterproofing unit may include a waterproofing member which is located between the window 151*a* and the front case 101, between the front case 101 and the rear case 102, or between the rear case 102 and the rear cover 103, to hermetically seal an inner space when those cases are coupled.

FIG. 2 depicts certain components as arranged on the mobile terminal 100. However, alternative arrangements are possible and within the teachings of the instant disclosure. Some components may be omitted or rearranged. For example, the first manipulation unit 123*a* may be located on another surface of the terminal body, and the second audio output module 152*b* may be located on the side surface of the terminal body.

In addition, the display unit 151 outputs information processed in the mobile terminal 100 and may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be a film having a touch pattern, disposed between the window 151a and a display on a rear surface of the window 151a, or a metal wire patterned directly on the rear surface of the window 151a. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (FIG. 1). Therefore, the touch screen may replace at least some of the functions of the first manipulation unit 123a. In addition, the first audio output module 152a may be implemented in the form of a speaker to output voice audio, alarm sounds, multimedia audio reproduction, and the like.

The window of the display unit 151 will typically include an aperture to permit audio generated by the first audio output module 152a to pass. One alternative is to allow audio to be released along an assembly gap between the structural bodies (for example, a gap between the window 151a and the front case 101). In this instance, a hole independently formed to output audio sounds may not be seen or is otherwise hidden in terms of appearance, thereby further simplifying the appearance and manufacturing of the mobile terminal 100.

In addition, the optical output module 154 can output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121a can process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion, and may employ any tactile method that allows the user to perform manipulation such as touch, push, scroll, or the like. The first and second manipulation units 123a and 123b may also employ any non-tactile method that allows the user to perform manipulation such as proximity touch, hovering, or the like.

FIG. 2 illustrates the first manipulation unit 123a as a touch key, but possible alternatives include a mechanical key, a push key, a touch key, and combinations thereof. Input received at the first and second manipulation units 123a and 123b may be used in various ways. For example, the first manipulation unit 123a may be used by the user to provide an input to a menu, home key, cancel, search, or the like, and the second manipulation unit 123b may be used by the user to provide an input to control a volume level being output from the first or second audio output modules 152a or 152b, to switch to a touch recognition mode of the display unit 151, or the like.

As another example of the user input unit 123, a rear input unit may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123a in the rear input unit. As such, in situations where the first manipulation unit 123a is omitted from the front side, the display unit 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b is shown located at the rear side of the terminal body and includes an image capturing direction that is substantially opposite to the image capturing direction of the first camera unit 121a. If desired, second camera 121a may alternatively be located at other locations, or made to be moveable, in order to have a different image capturing direction from that which is shown.

The second camera 121b can include a plurality of lenses arranged along at least one line. The plurality of lenses may also be arranged in a matrix configuration. The cameras may be referred to as an "array camera." When the second camera 121*b* is implemented as an array camera, images may be captured in various manners using the plurality of lenses and images with better qualities.

As shown in FIG. 2, the second audio output module 152*b* can be located on the terminal body. The second audio output module 152*b* may implement stereophonic sound functions in conjunction with the first audio output module 152*a*, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body. The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may cooperate with the display unit 151 to extend the function of the mobile terminal 100. Another example of the accessory is a touch pen for assisting or extending a touch input to a touch screen.

A terminal 100 according to various embodiments can generate and display various wallpapers on the display unit 151. The terminal 100 can modify the displayed wallpaper according to various modification conditions and display the modified wallpaper on the display unit 151. In this instance, the wallpaper may correspond to an image displayed on a lock screen or a home screen of the terminal 100. Hence, the wallpaper may have an image form, a video form, or a form in which an image and a video are mixed. The modification condition may correspond to a modification period. Regarding this, it shall be explained in detail in the following.

Next, FIG. 3 is a diagram illustrating a cover window 1511, a display unit 151 and a sensing unit 140 implemented to perform sensing via a hole 1520 formed in the display unit 151. In addition, the mobile terminal 100 includes a housing defining a predetermined accommodating space and of which one surface has the cover window 1511 provided thereon, while the cover window 1511 is configured to transmit light. As shown in FIG. 3, the display unit 151 is provided under the cover window 1511; a hole 1520*a* is provided in contact with a lower surface of the cover window 1511, while penetrating the display unit 151; and a sensor unit 140 is provided under the display unit 151 and implemented to sense the light transmitting through the cover window 1511 via the hole 1520*a*.

Further, the display unit 151 of the mobile terminal may be provided as an OLED (Organic Light Emitting Diode) configured to emit light spontaneously, which is different than an LCD (Liquid Crystal Display) configured to transmit light via a back side. Alternatively, the display unit 151 of the mobile terminal may be provided as a POLED (Plastic Organic Light Emitting Diode)) which provides more flexibility in the design of the display unit. FIG. 3 illustrates the display unit 151 which is provided as a POLED.

The display unit 151 in FIG. 3 includes a polarizing plate 1513 configured to shut off reflection of external light sources; a light adhesive film 1512 provided to adhere the polarizing plate 1513 to the cover window 1511; an organic light emitting layer 1515 having a spontaneous light emitting element; a film 1514 disposed between the polarizing plate 1513 and the organic light emitting layer 1515 and configured to shut off a plurality of spontaneous light emitting elements from oxygen or moisture; a transistor film 1516 provided under the organic light emitting layer 1515 and having a thin film transistor configured to control electric currents flowing to the spontaneous light emitting elements; a plastic substrate 1517 having the transistor film 1516 disposed thereon; and a protective film 1518 supporting the plastic substrate 1517.

In addition, the sensing unit 140 corresponds to an element configured to sense light or a signal via the hole. Examples of the sensing unit 140 include the camera 121 or user input unit 123 mentioned above. One reason why the hole 1520*a* is provided to penetrate the display unit 151 disposed under the cover window 1511 is as follows.

The transmittance of the polarizing plate 1513 will decrease according to the principle of light polarization, so that it is preferred that the hole 1520 is provided to allow the sensing unit 140 to sense the light or signal precisely. Further, the organic light emitting layer 1513 may include a cathode 1515*e* (FIG. 5) to form an electrode to facilitate flow of electric currents to spontaneous light emitting elements 1515*b* (FIG. 4). The cathode 1515*e* may serve as a reflection layer for reflecting the light forwardly to the front of the mobile terminal 100 via the cover window 1511. Accordingly, it is preferred that the organic light emitting layer 1513 includes the hole 1520*a* as having a not so good transmittance.

So as to locate the holes 1520*a* in parallel, it is easier to form the hole 1520*a* at once when the hole-penetrating areas of the layers 1520 are disposed in parallel as multilayers than to dispose the layers as multilayers after forming the hole 1520*a* in each layer.

Hereinafter, the elements located adjacent to the hole-penetrating areas of the layers 1512-1518 which compose the display unit 151 will be described. In particular, FIG. 4 is a front view of the organic light emitting layer which composes the display unit 151. The organic light emitting layer 1515 may include the plurality of the spontaneous light emitting elements 1515*b* emitting green, red and blue lights, respectively, aligned in the organic light emitting layer 1515.

FIG. 4(*a*) illustrates the area in which the hole 1520 is not provided, and FIG. 4(*b*) illustrates a front view of the organic light emitting layer 1515 near the hole-penetrating area. As shown, the plurality of the spontaneous light emitting elements 1515*b* may be arranged in the organic light emitting layer 1515, spaced a preset distance apart from the hole 1520*a* in a state where a first margin 1520*b* covering the hole 1520*a* is located therebetween. In other words, the first margin 1520*b* may be provided between the plurality of the spontaneous light emitting elements 1515*b* and the hole 1520*a*.

The spontaneous light emitting element 1515b has a disadvantage of a short or reduced life span which is shortened or reduced by the oxidation caused by oxygen or moisture so an encapsulation process for shutting the elements off from oxygen or moisture is provided. The encapsulation process covers the organic light emitting layer 1515 with a film 1514 (FIG. 3) formed of an organic and/or inorganic substance(s) so as to shut off the spontaneous light emitting elements 1515b from oxygen or moisture.

In this instance, some of the spontaneous light emitting elements 1515b located near the hole 1520a need to be shut off from the oxygen or moisture of the hole 1520a. Accordingly, the film 1514 (FIGS. 3 and 7) can cover the first margin 1520b and then protect the spontaneous light emitting elements 1515b adjacent to the hole 1520a from the oxygen or moisture inside the hole 1520a.

Next, FIG. 5 is a sectional diagram schematically illustrating the transistor film 1516 and the organic light emitting layer 1515 which are provided in the display unit 151. The transistor film 1516 includes an overcoat layer 1516a; a thin film transistor 1516b and a gate insulating layer 1516c. The overcoat layer 1516a formed of an organic insulating material such as polyamide or photoacrylic may be disposed on the thin film transistor 1516b and configured to eliminate a step formed by the thin film transistor 1516b.

In addition, the thin film transistor 1516b may include a source 302 and a drain 303 which are configured to supply and receive an electrode; an active layer 307 through which electric currents flow; and a gate 301 configured to adjust the flow or cut-off of the electric currents flowing through the active layer 307. The gate insulating layer 1516c separates the gate 301 and the active layer 307 from each other.

The organic light emitting layer 1515 may include a cathode electrode 1515e and an anode electrode 1515d which are connected to the drain 303 arranged on the overcoat layer 1516a; and the spontaneous light emitting elements 1515b configured to emit light once electric currents flow between both electrodes. The organic light emitting layer 1515 may further include a bank 1515c formed of an inorganic insulating material such as SiNx and provided between the spontaneous light emitting elements 1515b to define a non-light-emitting area.

In this instance, the bank 1515c can be spaced a preset distance apart from the hole 1520a, with a second margin covering the hole 1520a being located therebetween. It is preferred that the second margin is provided in the first margin 1520b. That is because the film 1514 (FIGS. 3 and 7) is provided in the second margin for shutting off the spontaneous light emitting elements 1515 from the moisture or oxygen inside the hole 1520a.

Next, the wiring near the hole 1520a of the transistor film 1516 will be described. In particular, FIG. 6 is a diagram illustrating the structure of the wiring formed in the transistor film 1516 provided in the display unit 151.

The transistor film 1516 may include a current wire 304 configured to provide a first signal for driving the thin film transistor. The current wire 304 is connected to the gate 301 (FIG. 5) to serve as a switch for allowing the flow of currents to the active layer 307 (FIG. 5).

The current wire 304 may include a curve 304a provided in a first direction and formed to make a detour around the hole 1520a near the hole-penetrating area. The transistor film 1516 may include a data wire 305 configured to provide a second signal for realizing an picture or image on the cover window by flowing the current to the spontaneous light emitting elements 1515b when the thin film transistor is driven. The data wire 305 may be provided in a second direction and formed to make a detour around the hole 1520a near the hole-penetrating area.

Next, FIG. 7 illustrates a sectional diagram schematically illustrating the cover window 1511 and the display unit 151 and a sectional diagram enlargedly illustrating the organic light emitting layer 1515 and the film 1514 near the hole 1520a. The light adhesive film 1512 may include a bezel area 1512a formed along an edge of the light adhesive film 1512.

The bezel area 1512a may be formed as a colored area to prevent the unnecessary escaping of light outside the display unit and to hide the other electronic components (e.g., the antenna and the like) provided in the display unit 151. The bezel area 1512a may be formed in an edge area of an image or picture realizing area, while covering the image realizing area. The hole may be provided in the bezel area 1512a.

The film 1514 may be formed to surround a lateral surface of the organic light emitting layer 1515 to prevent moisture or oxygen from permeating from the outside of the display unit. Further, the organic light emitting layer 1515 may include an unevenness 1516f spaced apart therefrom to surround the organic light emitting layer 1515.

In addition, the film 1514 may be configured to cover the unevenness 1516f and the hole 1512a may be located in an inner area of the display unit 151, compared with the unevenness 1516f. The film 1514 is disposed on the organic light emitting layer 1515 and provided in the first or second margin adjacent to the hole 1520a to shut off the spontaneous light emitting elements 1515b from the oxygen or moisture inside the hole 1520a.

Next, FIG. 8 is a diagram including a sectional view of the display unit 151 and the cover window 1511 having an auxiliary film 500 disposed on a front surface of the sensing unit 140 and an enlarged sectional view of the auxiliary film 500. The auxiliary film may be an electrochromic element 500. When the auxiliary film 500 is an electrochromic element, the electrochromic element may include a reducing discoloration material 502 and an oxidation discoloration material 503 which are disposed between transparent electrodes 501 and 504; and a liquid electrolyte containing Li+ion 505.

Transparency of the electrochromic element may be determined according to a traveling direction of the Li+ion 505 and the color of the electrochromic element may be determined according to the elements which compose the electrochromic element. Alternatively, the auxiliary film 500 may further include a polymer dispersed liquid crystal element.

In more detail, the polymer dispersed liquid crystal element may include a transparent conducting oxide film (ITO) disposed between transparent polyester (PET) films and connected to the power supply. A polymer having liquid crystal particles disposed between the transparent conducing oxide films (ITO). When the power is applied, the liquid crystal particles are arranged regularly to look transparent. When the power is cut off, the liquid crystal particles are arranged irregularly to look opaque.

More specifically, the electrochromic element or polymer dispersed liquid crystal element may be provided under the cover window 1511, adjacent to the hole 1520a, to keep a transparent state of the cover window when the sensing unit 140 is implemented and an opaque state when the sensing unit 140 is not implemented.

FIG. 9 is a diagram including the display unit 151 and the cover window 1511 having an auxiliary film disposed on a lower surface of the sensing unit 140 and an enlarged sectional view of the auxiliary film. The film provided under the sensing unit 140 may be a piezoelectric film 600.

Currents may flow to the piezoelectric film 600 when a preset pressure is applied to the sensing unit 140 via the cover window 1511. The piezoelectric film 600 may include a piezoelectric material 602 disposed between the positive and negative poles 601 and 603 and convert the preset pressure applied to the sensing unit 140 by the electric energy generated by the external physical stress into an electrical signal. The sensing unit 140 can be switched on and off or implemented to perform a specific operation based on the electrical signal converted from the pressure applied via the piezoelectric film 600.

Hereinafter, a manufacturing method of the mobile terminal including the display unit 151 will be described. According to the manufacturing process of the mobile terminal, the display unit 151 is formed and the hole 1520a penetrating the display unit 151 is then formed. Hence, the cover window 1511 is disposed on the display unit 151.

More specifically, to form the display unit 151, a plastic substrate 1517 is formed on a glass substrate and the transistor film 1516 having the thin film transistor is disposed on the plastic substrate 1517. Hence, the organic light emitting layer 1515, which includes the spontaneous light emitting elements configured to emit a preset colored light once the currents controlled by the thin film transistor flow to the transistor film 1516, is disposed on the transistor film 1516, and the film 1514 configured to shut off the spontaneous light emitting elements from oxygen or moisture is then disposed on the organic light emitting layer 1515. After that, the glass substrate is eliminated and the protection film 1518 is adhered to a back side of the plastic substrate 1517. Hence, the polarizing plate 1513 is disposed on the film 1514 and the hole 1520a is formed by penetrating from the protection film 1518 to the polarizing plate 1513.

After the plurality of the layers for forming the display unit 151 are disposed, the hole 1520a is formed via the layers and the cover window 1511 is then disposed on the polarizing plate 1513, so that the mobile terminal may be manufactured. In this instance, the order of disposing the plurality of the layers to form the display unit 151 may be changed.

The light adhesive film 1512 may be further disposed between the polarizing plate 1513 and the cover window 1511. After the light adhesive film 1512 formed of a transparent material is disposed on the polarizing plate 1513, the hole 1520a may be formed or the light adhesive film 1512 may be disposed after the hole 1520a is formed.

A FMM (Fine Metal Mask) method may be applied to the organic light emitting layer 1515 by forming the spontaneous light emitting elements 1515b. Further, it is efficient to dispose the spontaneous light emitting elements 1515b in the other area of the organic light emitting layer 1515 except the area where the hole 1520a is formed.

Hereinafter, the FMM method for disposing the spontaneous light emitting elements 1515b on the organic light emitting layer 1515 except the hole 1520 penetrating area will be described. In more detail, referring to FIG. 10. The process of forming the organic light emitting layer 1515 may include a step for locating the transistor film 1516 near a FMM 201 and disposing the spontaneous light emitting element 1515b by passing organic vapor therethrough.

The FMM 201 may include a second hole 203 having a first area which is blocked and a second area through which the organic vapor passes, while surrounding the first area. In other words, the organic vapor generated in the source 202 passes through the second hole 203 so as to dispose the spontaneous light emitting element 1515b. At this time, the FMM 201 has a blocked area which is corresponding to the hole-penetrating area 1520 so that the spontaneous light emitting element 1515b may be disposed in an outer area around the hole-penetrating area 1520.

The hole-penetrating area 1520 may include a first margin 1520b which surrounds the hole 1520a (FIG. 4). Accordingly, the spontaneous light emitting element may be disposed on the organic light emitting layer with locating the first margin 1520 surrounding the hole 1520a therebetween, spaced a preset distance apart from the hole 1520a.

In this instance, the film 1514 is formed while covering the hole-penetrating area 1520. After the hole 1520a penetrates the area, the film 1514 provided in the first margin 1520a can shut off the spontaneous light emitting element from the moisture or oxygen inside the hole 1520a.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds, are therefore intended to be embraced by the appended claims.

What is claimed is:

1. A mobile terminal comprising:
a housing having a front side, a rear side and lateral sides;
a cover window disposed on the front side of the housing and defining a display area and a bezel area, wherein the bezel area includes printed color under an edge of the cover window;
an OLED display unit disposed between the cover window and the front side of the housing; and
a sensing unit disposed under the OLED display unit,
wherein the OLED display unit comprises:
a substrate having a hole below the display area of the cover window;
a transistor layer including thin film transistors and being disposed on the substrate and having a hole corresponding to the hole of the substrate;
an organic light emitting layer disposed on the transistor layer and having a hole corresponding to the hole of the transistor layer; and
an encapsulation layer disposed on the organic light emitting layer and having a hole corresponding to the hole of the organic light emitting layer, and
wherein the sensing unit senses a light transmitted through the holes.

2. The mobile terminal of claim 1, wherein the OLED display unit further comprises:
a polarizing plate disposed on the encapsulation layer and having a hole corresponding to the hole of the encapsulation layer.

3. The mobile terminal of claim 1, wherein the organic light emitting layer includes a plurality of spontaneous light emitting elements disposed below the display area to respectively emit preset colors.

4. The mobile terminal of claim 3, wherein the OLED display unit comprises:
a polarizing plate disposed on the encapsulation layer and having a hole corresponding to the hole of the encapsulation layer;
a light adhesive film adhering the polarizing plate to the cover window and having a hole corresponding to the hole of the polarizing plate; and a protection film supporting the substrate,
wherein the encapsulation layer is provided between the polarizing plate and the organic light emitting layer, and
wherein the transistor layer controls currents flowing to the spontaneous light emitting elements.

5. The mobile terminal of claim 3, wherein the spontaneous light emitting elements are provided in the organic light emitting layer, spaced a preset distance apart from the hole of the organic light emitting layer by a margin area surrounding the hole of the organic light emitting layer, and
wherein the margin area is located between the hole of the organic light emitting layer and the spontaneous light emitting elements.

6. The mobile terminal of claim 5, wherein the spontaneous light emitting elements comprise:
a plurality of first elements have a first size; and
a plurality of second elements have a second size different from the first size, and
wherein some of the first elements and some of the second elements are disposed outside the margin area along a shape of the hole.

7. The mobile terminal of claim 5, wherein a width of the margin area is substantially the same in all directions.

8. The mobile terminal of claim 5, wherein the encapsulation layer is provided in the margin area and seals off the spontaneous light emitting elements from moisture or oxygen inside the holes.

9. The mobile terminal of claim 5, wherein the organic light emitting layer comprises a bank provided between the spontaneous light emitting elements and forming a non-light- emitting area, and
wherein the bank is spaced a preset distance apart from the hole of the organic light emitting layer by the margin area.

10. The mobile terminal of claim 5, wherein the encapsulation layer is provided in the margin area.

11. The mobile terminal of claim 1, wherein the transistor layer comprises a corresponding current wire providing a first signal for driving a corresponding thin film transistor, and
wherein the current wire is provided in a first direction and includes a curve detouring around the hole of the transistor layer.

12. The mobile terminal of claim 11, wherein the transistor layer comprises a corresponding data wire providing a second signal for realizing a picture or an image via the cover window by a flow of currents to the spontaneous light emitting elements connected to a corresponding thin film transistor when the corresponding thin film transistor is driven, and
wherein the data wire is provided in a second direction including a curve detouring around the hole of the transistor layer.

13. The mobile terminal of claim 4, wherein the bezel area is printed along an edge area of the light adhesive film.

14. The mobile terminal of claim 1, further comprising:
an electrochromic element provided under the cover window.

15. The mobile terminal of claim 1, further comprising:
a polymer dispersed liquid crystal provided in the cover window.

16. The mobile terminal of claim 1, further comprising:
a piezoelectric film provided under the sensing unit and configured to flow currents therethrough when a preset pressure is applied to the sensing unit via the cover window.

17. The mobile terminal of claim 1, wherein the encapsulation layer includes a tapered edge part on an edge area of the substrate, and
wherein the tapered edge part has an inclined surface that is lowered toward an outermost edge of the substrate.

18. The mobile terminal of claim 1, wherein the sensing unit includes a camera.

19. A mobile terminal comprising:
a housing having a front side, a rear side and lateral sides;
a cover window disposed on the front side of the housing and defining a display area and a bezel area, wherein the bezel area includes printed color under an edge of the cover window;
an OLED display unit disposed between the cover window and the front side of the housing; and
a sensing unit disposed under the OLED display unit,
wherein an organic light emitting layer of the OLED display unit comprises:
a first hole disposed below the display area of the cover window;
at least one of first spontaneous light emitting elements disposed below the display area of the cover window and having a first size; and
at least one of second spontaneous light emitting elements disposed below the display area of the cover window and having a second size different from the first size, and
wherein the sensing unit senses a light transmitted through the first hole.

20. The mobile terminal of claim 19, wherein the OLED display unit further comprises:
a substrate having a second hole corresponding to the first hole;
a transistor layer including thin film transistors and being disposed on the substrate and having a third hole corresponding to the second hole; and
an encapsulation layer disposed on the organic light emitting layer and having a fourth hole corresponding to the first hole, and
wherein the organic light emitting layer is disposed on the transistor layer.

21. The mobile terminal of claim 20, wherein the OLED display unit further comprises:
a polarizing plate disposed on the encapsulation layer and having a fifth hole corresponding to the fourth hole.

22. The mobile terminal of claim 21, wherein the OLED display unit further comprises:
a light adhesive film adhering the polarizing plate to the cover window and having a sixth hole corresponding to the fifth hole of the polarizing plate; and
a protection film supporting the substrate.

23. The mobile terminal of claim 19, wherein the first and second spontaneous light emitting elements are spaced a preset distance apart from the first hole by a margin area surrounding the first hole,
wherein the margin area is located between the first and second spontaneous light emitting elements, and the first hole, and
wherein some of the first spontaneous light emitting elements and some of the second spontaneous light emitting elements are disposed outside the margin area along a shape of the first hole.

24. The mobile terminal of claim 23, wherein the organic light emitting layer comprises a bank provided between the spontaneous light emitting elements, and
wherein the bank is spaced a preset distance apart from the first hole by the margin area.

25. The mobile terminal of claim 20, wherein the transistor layer comprises a corresponding current wire providing a first signal for driving a corresponding thin film transistor, and wherein the current wire is provided in a first direction and includes a curve detouring around the third hole of the transistor layer.

26. The mobile terminal of claim 25, wherein the transistor layer comprises a corresponding data wire providing a second signal for realizing a picture or an image via the cover window by a flow of currents to the first and second spontaneous light emitting elements connected to a corresponding thin film transistor when the corresponding thin film transistor is driven, and wherein the data wire is provided in a second direction including a curve detouring around the third hole of the transistor layer.

27. The mobile terminal of claim 20, wherein the encapsulation layer includes a tapered edge part on an edge area of the substrate, and wherein the tapered edge part has an inclined surface that is lowered toward an outermost edge of the substrate.

28. The mobile terminal of claim 19, wherein the sensing unit includes a camera.

* * * * *